United States Patent
Chen

(10) Patent No.: US 10,873,149 B2
(45) Date of Patent: Dec. 22, 2020

(54) HIGH PERFORMANCE STACKED CONNECTOR

(71) Applicant: Amphenol Corporation, Wallingford, CT (US)

(72) Inventor: Xingye Chen, Markham (CA)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 16/388,560

(22) Filed: Apr. 18, 2019

(65) Prior Publication Data

US 2019/0326703 A1    Oct. 24, 2019

Related U.S. Application Data

(60) Provisional application No. 62/659,694, filed on Apr. 18, 2018.

(51) Int. Cl.
| | | |
|---|---|---|
| H01R 13/00 | (2006.01) | |
| H01R 13/514 | (2006.01) | |
| H05K 7/20 | (2006.01) | |
| H01R 12/53 | (2011.01) | |
| H04B 10/80 | (2013.01) | |
| H01R 13/6581 | (2011.01) | |
| H04B 10/40 | (2013.01) | |

(52) U.S. Cl.
CPC ........... *H01R 13/514* (2013.01); *H01R 12/53* (2013.01); *H01R 13/6581* (2013.01); *H04B 10/40* (2013.01); *H04B 10/801* (2013.01); *H05K 7/20154* (2013.01)

(58) Field of Classification Search
CPC . G01J 1/0271; H05K 9/0024; H05K 7/20154; H01R 13/514; G02B 6/4269; G02B 6/4261; G02B 6/4246
USPC ........................................................ 439/487
See application file for complete search history.

(56) References Cited

U.S. PATENT DOCUMENTS

| | | | |
|---|---|---|---|
| 6,692,231 B1 * | 2/2004 | Calvert | ................... F04D 29/36 416/153 |
| 9,915,560 B2 * | 3/2018 | Ho | ........................ G01J 1/0271 |
| 10,153,571 B2 | 12/2018 | Kachlic | |
| 10,588,243 B2 * | 3/2020 | Little | ................... H05K 9/0024 |
| 2012/0003848 A1 | 1/2012 | Casher et al. | |
| 2017/0077643 A1 | 3/2017 | Zbinden et al. | |
| 2019/0319395 A1 | 10/2019 | Bakshan et al. | |

OTHER PUBLICATIONS

U.S. Appl. No. 16/383,533, filed Apr. 12, 2019, Bakshan et al.

* cited by examiner

*Primary Examiner* — Jean F Duverne
(74) *Attorney, Agent, or Firm* — Wolf, Greenfield & Sacks, P.C.

(57) ABSTRACT

A cage for a stacked I/O connector that provides heat dissipation sufficient to support operation of QSFP-DD transceivers with a conventionally-sized cooling fan. The cage includes a second channel, between a first and a third channel that are sized and positioned adjacent ports of a connector so as to receive two transceivers. A face of the second channel may have a pattern of openings that enables a high airflow yet blocks electromagnetic radiation that would otherwise contribute to EMI. An element, adjacent the channel that similarly has a pattern of holes enabling high airflow, may further block EMI.

18 Claims, 5 Drawing Sheets

HIGH PERFORMANCE STACKED CONNECTOR

CROSS-REFERENCE TO RELATED APPLICATIONS

This application claims the benefit under 35 U.S.C. § 119(e) of U.S. Provisional Patent Application Ser. No. 62/659,694, filed on Apr. 18, 2018, entitled "HIGH PERFORMANCE STACKED CONNECTOR," which is hereby incorporated herein by reference in its entirety.

BACKGROUND

An electronic system may include two or more electronic devices connected with a cable. The devices may have input/output (I/O) connectors for connecting with plug connectors terminating the ends of the cable. The cable may be constructed to carry electrical or optical signals. For transmitting optical signals, a transceiver is provided at one end of the cable for converting the optical signals to electrical signals.

The plugs and I/O connectors may be constructed according to standards that enable components from different manufacturers to mate. For example, the Quad Small Form-factor Pluggable (QSFP) standard defines a compact, hot-pluggable transceiver used for data communications applications. The form factor and electrical interface are specified by a multi-source agreement (MSA) under the auspices of the Small Form Factor (SFF) Committee. Components made according to the QSFP standard is widely used to interface networking hardware (such as servers and switches) to fiber optic cables or active or passive electrical connections.

A QSFP plug mates with a receptacle, which is typically mounted on a printed circuit board (PCB). To block electromagnetic interference (EMI), the receptacle may be located within a metal cage also mounted to the PCB. The receptacle is typically set back from the edge of the PCB and located at the back portion of the cage. The front portion of the cage usually extends through a panel of an electronic device and has an opening for receiving the QSFP transceiver. A channel extends from the opening at the front portion of the cage toward the rear portion to guide the transceiver into engagement with the receptacle. Such an arrangement may be used to connect a circuit board inside an electronic device to an external device using a cable.

A transceiver for converting optical signals to electrical signals may consume a lot of power, and therefore generate a lot of heat. A QSFP transceiver might consume 12 Watts (W) of power, for example. Transceivers that process more signals, such as transceivers made according to a QSFP-DD standard, may consume up to 15 W. Large amounts of heat may cause the temperature around electronic, optical, or other components to exceed the rated operating temperature, contributing to errors during operation or reducing the lifetime of the components. Heat generated by a transceiver may be dissipated through the use of a cooling fan that flows air over the metal cage. Heat sinks may be mounted to the outside of the cage to further dissipate heat from the transceiver.

In some systems, two or more transceivers are disposed in close proximity to each other. I/O connectors may be configured in a "stacked" configuration to support use of multiple transceivers. For example, an upper transceiver and lower transceiver stacked within one cage to make a double stacked connector.

SUMMARY

In one aspect, the invention relates to a cage for an electrical connector. The cage includes a first channel defined by conductive walls and configured to receive a transceiver, and a second channel defined by conductive walls and adjacent the first channel, where the second channel includes a face. The face includes a plurality of holes therethrough. The plurality of holes are arranged in a plurality of lines extending in a first direction. Each of the plurality of lines is offset, in the first direction, from an adjacent line such that holes in the line are disposed between holes of the adjacent line.

In another aspect, the invention relates to an electronic system. The electronic system includes an enclosure having a panel with at least one opening therethrough, a printed circuit board within the enclosure, a connector mounted to the printed circuit board, a cage mounted to the printed circuit board with the connector enclosed by the cage, and at least one fan positioned to cause air to flow over the cage. The cage includes a first channel, a second channel and a third channel having ends exposed in the opening. The second channel is between the first channel and the third channel. The end of the second channel includes a surface where the surface includes a plurality of holes therethrough. The plurality of holes are disposed in a plurality of rows with the holes in each of the plurality of rows being staggered with respect to holes in an adjacent row such that holes in the row are between holes in the adjacent row in a first direction parallel to the plurality of rows.

In another aspect, the invention relates to a method of operating an electronic system in an ambient environment. The electronic system includes, within an enclosure, a stacked cage including stacked first, second and third channels, where the second channel has a face at an end, the face including a plurality of holes therethrough. The method includes transmitting or receiving optical signals with a transceiver disposed within each of the first and third channels consuming between 10 and 12 W and flowing air through openings in the face of the second channel with a fan within the enclosure operating at a static pressure between 0.8 and 1.5 IW, thereby dissipating heat from the transceivers in the first and third channels at a rate such that a temperature rise of both transceivers relative to an off state of the transceivers is less than 25 degrees C. in an ambient environment of 25 degrees C.

The foregoing is a non-limiting summary of the invention, which is defined by the appended claims.

DETAILED DESCRIPTION

Figure 1:
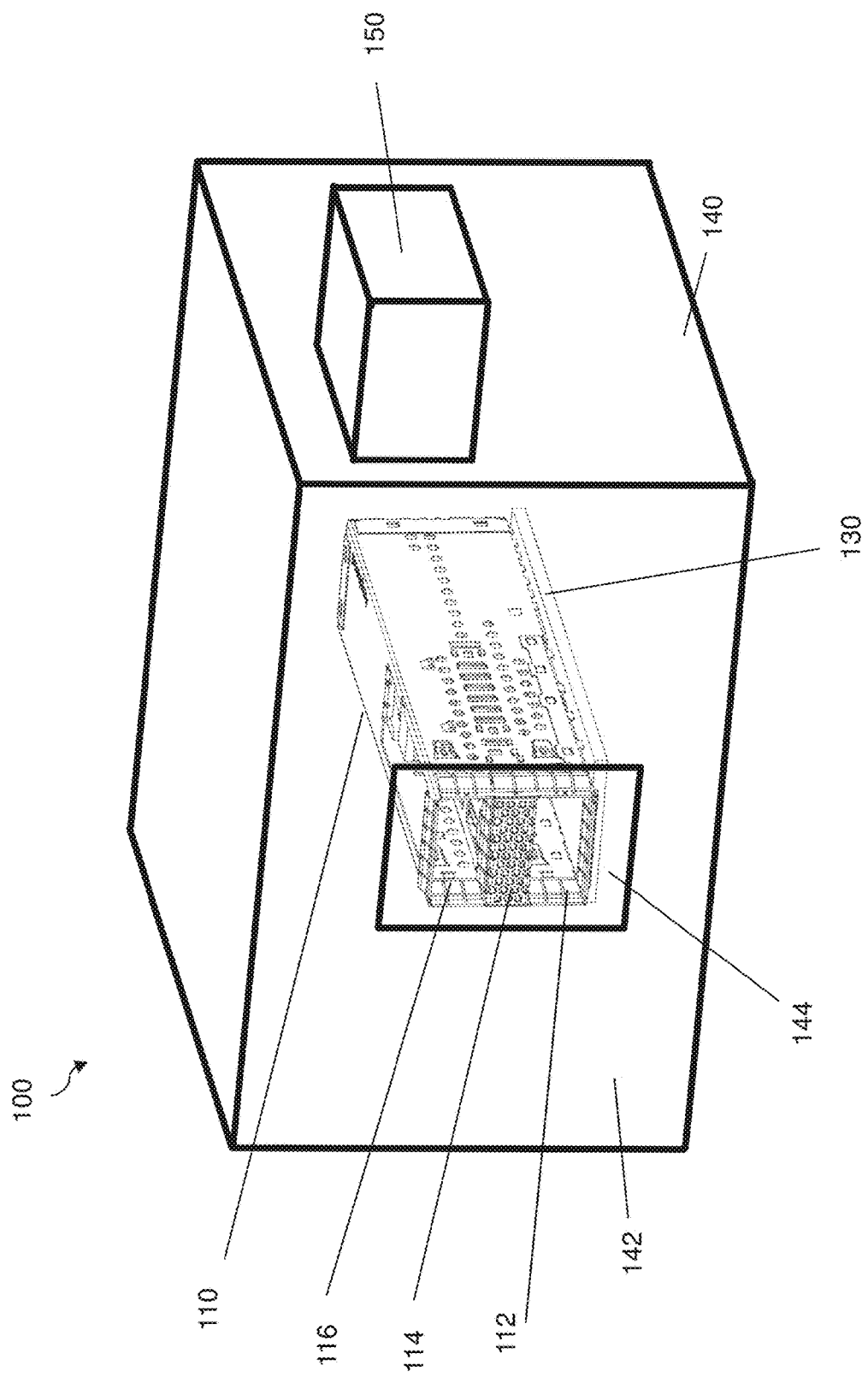
FIG. 1 is a front-right perspective view of an electronic connection system according to some embodiments.

The present disclosure is directed to an electronic connection system, which may be compliant with QSFP standards in at least one aspect. The inventors have recognized and appreciated designs that enable an increased density of I/O connections. The inventors have recognized and appreciated that an increased density of I/O connections may require improved heat dissipation from I/O connectors. Increased density may arise from transceivers that process more signals in the same space, such as may arise in transceivers compliant with the QSFP-DD standard. Additionally, increased density may result from "stacking" connectors, which results in transceivers one above the other with only a small space between them. The inventors have further recognized and appreciated techniques to provide improved heat dissipation even for stacked connectors.

Those techniques may entail forming holes in a surface of a cage designed to enclose a transceiver. The holes may be formed in a pattern to increase air flow through a middle channel of the cage, which is between two other channels configured to receive transceivers. The holes may be in a pattern that increases, relative to conventional cages, the total area of a surface of the cage through which cooling air may flow for cooling. Nonetheless, the hole pattern is such that the amount of electromagnetic radiation that passes through the holes does not interfere with the function of the cage to limit EMI. In accordance with some embodiments, the holes may be in a honeycomb pattern.

In a stacked connector, for example, there may be a cage for electrical connectors that includes a first, second, and third channel where the second channel is between the first and third channel. The illustrated configuration is a double stacked configuration, providing an I/O connector that can receive two transceivers, one above the other. The first channel and third channel are each capable of receiving an optical or other type of transceiver. The transceiver may be a QSFP transceiver, such as a QSFP-DD transceiver. In this regard, the first channel and/or the third channel may be compliant with QSFP standards. A heat sink may be mounted on the top of the third channel to dissipate heat from a transceiver, but a heat sink mounted to the top of the third channel may not dissipate heat effectively from the first channel. The second channel may be used to increase heat dissipated from the first channel. Air may be flowed through holes in a face of the end of the second channel to increase heat dissipation.

The holes may be arranged in way such to increase, relative to a conventional cage, the area they occupy. In some embodiments, the holes may be arranged along lines extending in a first direction, with the lines offset in the first direction such that the holes of adjacent lines are between each other in the first direction. In some embodiments, the distance between the lines that the holes are arranged on may be less than the width of the holes. In some embodiments, the holes may have perimeters with straight edges and at least a portion of the holes may be hexagons. In some embodiments, the holes may be arranged in a honeycomb pattern, which may increase the collective area of the holes on the and therefore also increase airflow through the second channel. Embodiments may be constructed with one or more of these techniques to increase the area of a surface of the cage through which cooling air may flow.

A large area of holes in the cage may allow EMI to pass through the cage at an unacceptable level. An EMI block may be placed at the end 214 of the second channel. The EMI block may have holes that align with the holes through the face, and may be elongated in a direction aligned with the airflow. The EMI block may prevent EMI from escaping at an unacceptable level without decreasing airflow significantly. Using a pattern of holes as described herein, a face at the end of the second channel with holes making up at least 40%, at least 50%, or between 50% and 60% of the area of the face may increase heat dissipation from the first channel while not allowing EMI to escape at an unacceptable level.

Illustrative embodiments are shown in FIGS. 1-4. As shown in FIG. 1, an electronic system 100 may include an enclosure 140, the enclosure including a panel 142 with at least one opening 144 therethrough. The electronic system 100 may also include a printed circuit board 130 within the enclosure 140. The electronic system 100 may also include a cage 110. The cage 110 may be mounted to the printed circuit board 130 and may enclose a connector 120 (FIG. 2) mounted to the printed circuit board 130. The electronic system 100 may also include a fan 150.

In some embodiments, the cage 110 may be configured to provide shielding from electromagnetic interference. The cage 110 may be formed from any suitable metal or other conductive material and connected to ground for shielding against EMI using techniques known to one of skill in the art. The cage 110 may be formed from sheet metal bent into a suitable shape. However, some or all of the components of the cage may be made of other materials, such as die cast metal.

Figure 2:
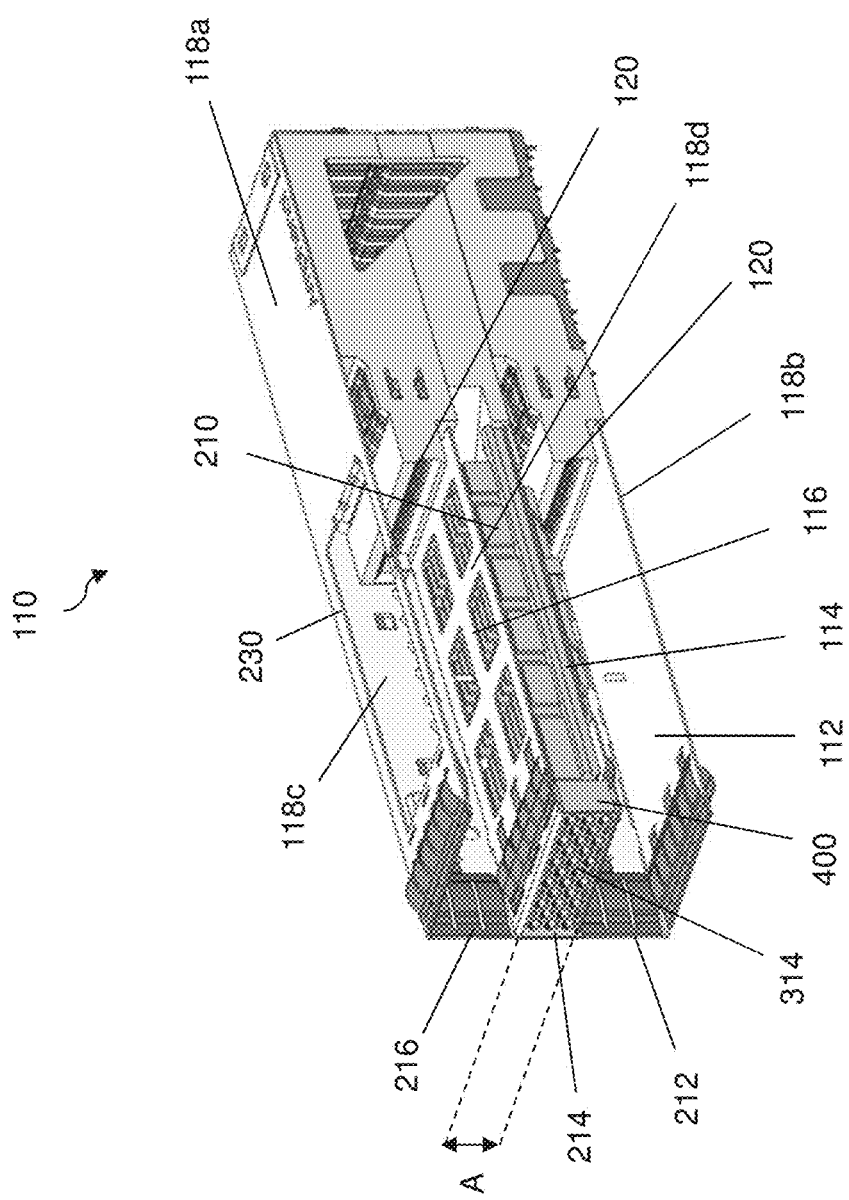
FIG. 2 is a front-right perspective view of a cage for an electrical connector according to an embodiment of a cage adapted to receive a heat sink.

As shown in FIGS. 1 and 2, the cage 110 may include a first channel 112. The first channel 112 may include an end 212. In the illustrated embodiment, end 212 is exposed in opening 144. The cage 110 may include a second channel 114. The second channel 114 may include an end 214. In the illustrated embodiment, end 214 is also exposed in opening 144. The cage 110 may include a third channel 116. The third channel 116 include an end 216. In the illustrated embodiment, end 216 is also exposed in the opening 144. In the embodiment illustrated, second channel 114 is between the first channel 112 and the third channel 116. The first channel 112 may be adjacent the printed circuit board 130.

In various embodiments, the second channel may have a length greater than 40 millimeters (mm), less than 60 mm, or in some embodiments, between 40 and 60 mm. In some embodiments, the length of the second channel may be between 49 and 51 mm, for example, 50 mm.

Figure 5:
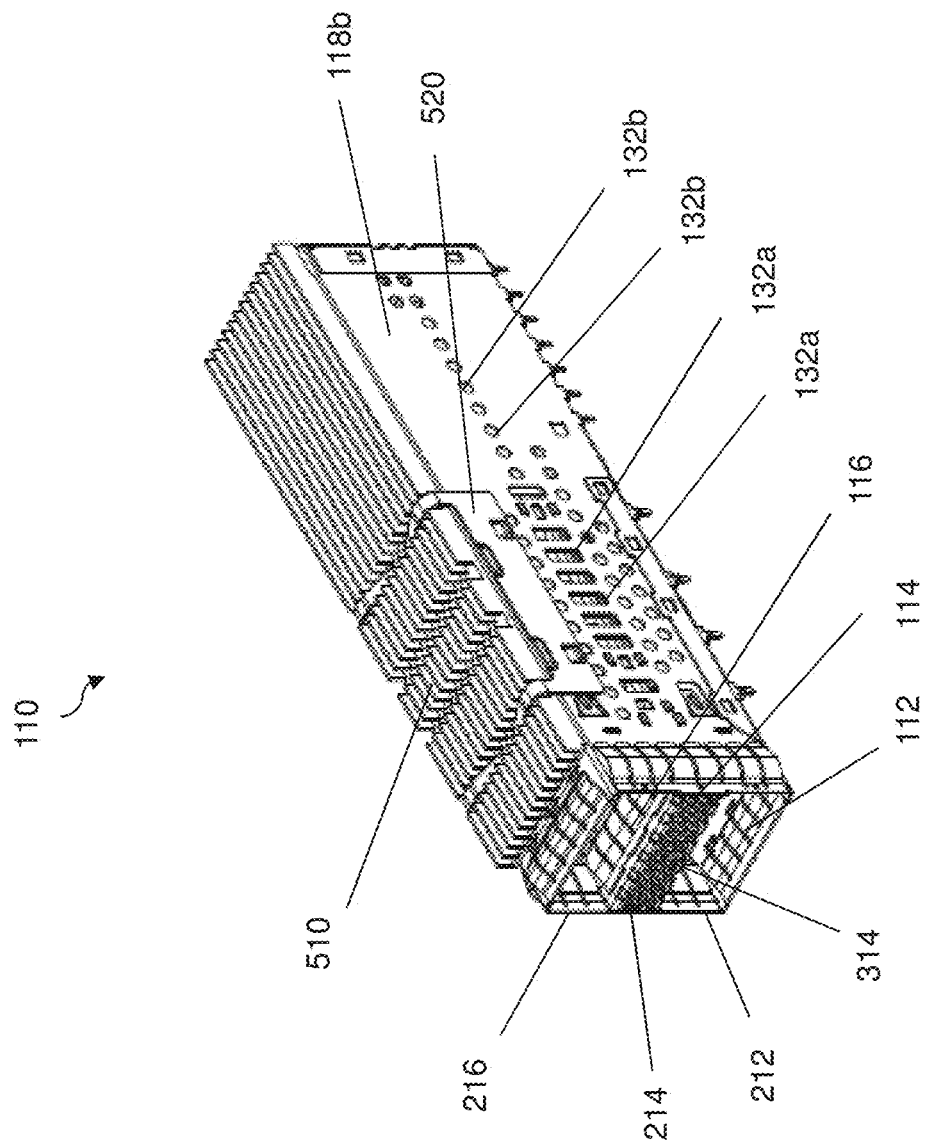
FIG. 5 is a front-right perspective view of a cage for an electrical according to an embodiment of a cage with a heat sink.

The cage 110 may be bounded by conductive top walls 118a, conductive bottom walls 118b, and conductive side walls 118c. The bottom wall 118b may serve as the bottom wall of first channel 112. Top wall 118a may serve as the top wall for the third channel 116. Partitions 118d internal to cage 110 may form the top and bottom walls of second channel 114. One or more wall pieces may combine to provide shielding. FIG. 5 shows an embodiment in which a heat sink 510 contributes to shielding. In some embodiments, the internal partitions 118d may have openings, which may allow heat from a transceiver installed in the first or third channel to flow into the second channel. The first channel 112 may be separate from the third channel 116 by a distance A. In some embodiments, the distance A may be 8 mm or less. In some embodiments, the distance A is measured not including the internal partitions forming the second channel; in these embodiments distance A may be 5.98 mm. In some embodiments, the distance A is measured including the internal partitions forming the second channel; in these embodiments distance A may be 6.48 mm.

In the embodiment illustrated, the ends 212 and 216 of the first and third channels may be open, such that transceivers may be inserted into the first and third channels to mate with connector ports at the rear of each of the first and third channels. According to some embodiments, the first channel 112 and the third channel 116 may each be configured to receive and/or guide a transceiver to connect to a connector 120 in order to establish connections between the transceiver and the connector 120, which in the embodiments illustrated are electrical connections. For some applications, the connectors 120, transceivers, and other elements of the interconnection system may be configured in accordance with one or more Small Form Factor (SFF) standards, such as QSFP or QSFP-DD. However, it is to be understood that the components of the electronic connection system may configured to be compliant with one or more other industry standards or no standards at all, if desired.

In the embodiment illustrated in FIG. 2, the top wall 118a may include an opening 230 therein. That opening 230 may enable a heat sink 510 mounted to a top surface of the cage to contact a transceiver installed within the third channel. A heat sink 510 may be mounted to the top surface of the cage using a clip 520. Such a heat sink 510 is optional. FIG. 2 shows an opening 230 in the top wall of the third channel to enable a heat sink 510 to contact a transceiver in the third channel, whereas FIG. 1 shows a cage without such an opening. FIG. 5 shows a perspective view of how a heat sink 510 may be mounted to the top surface of a cage having an opening 230 using clip 520. The heat sink 510 may contact a portion of a top wall 118a.

The second channel 114 may have a surface at its end 214. That surface may fill the opening between the first and third channels, blocking radiation, which can lead to EMI, from passing through the end of the second channel. That surface may include multiple openings to enable cooling air to flow into the second channel. The surface may be a face.

Figure 3:
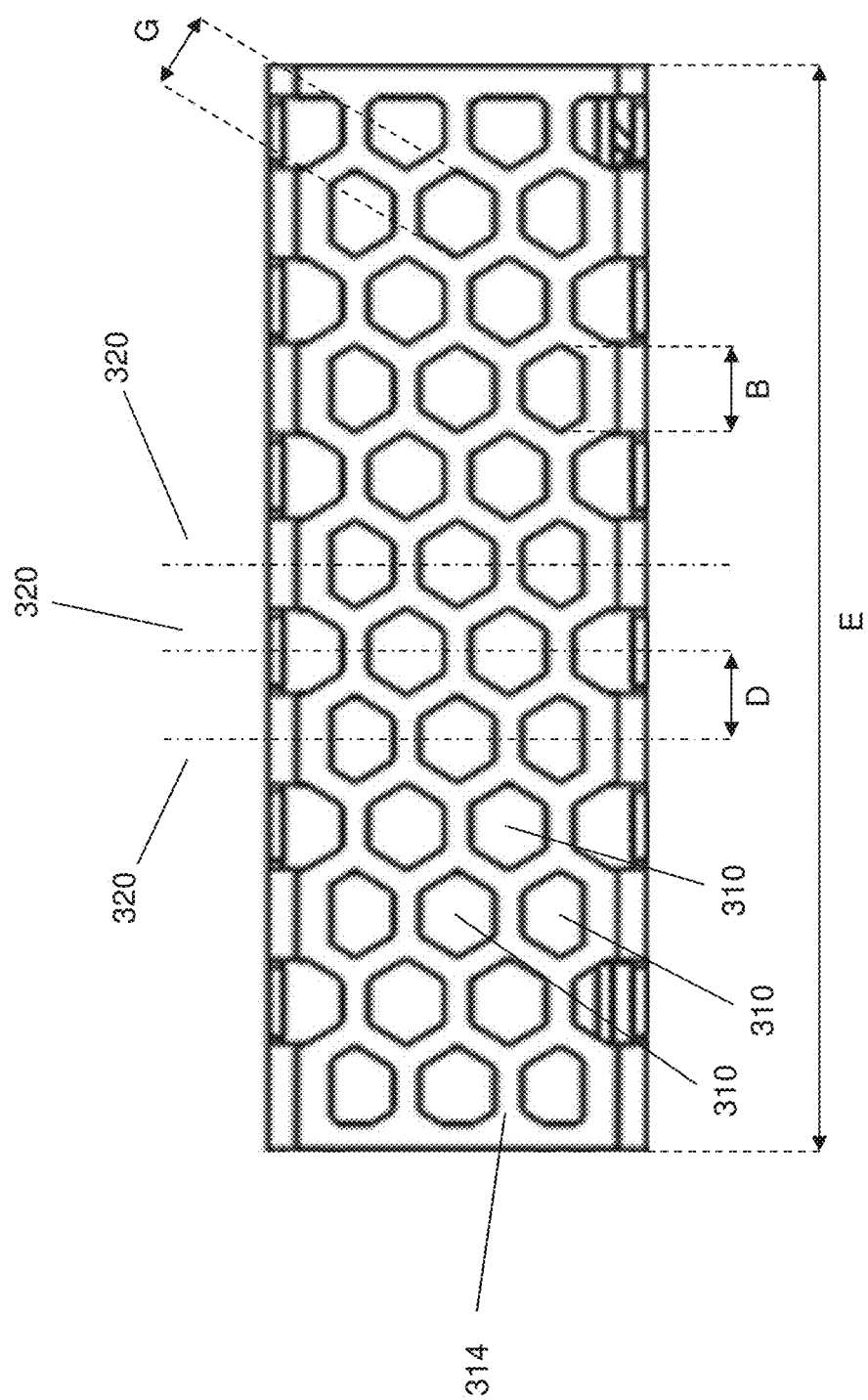
FIG. 3 is a front planar view of a face at the end of a channel of a cage for an electrical connector according to some embodiments.
Figure 4:
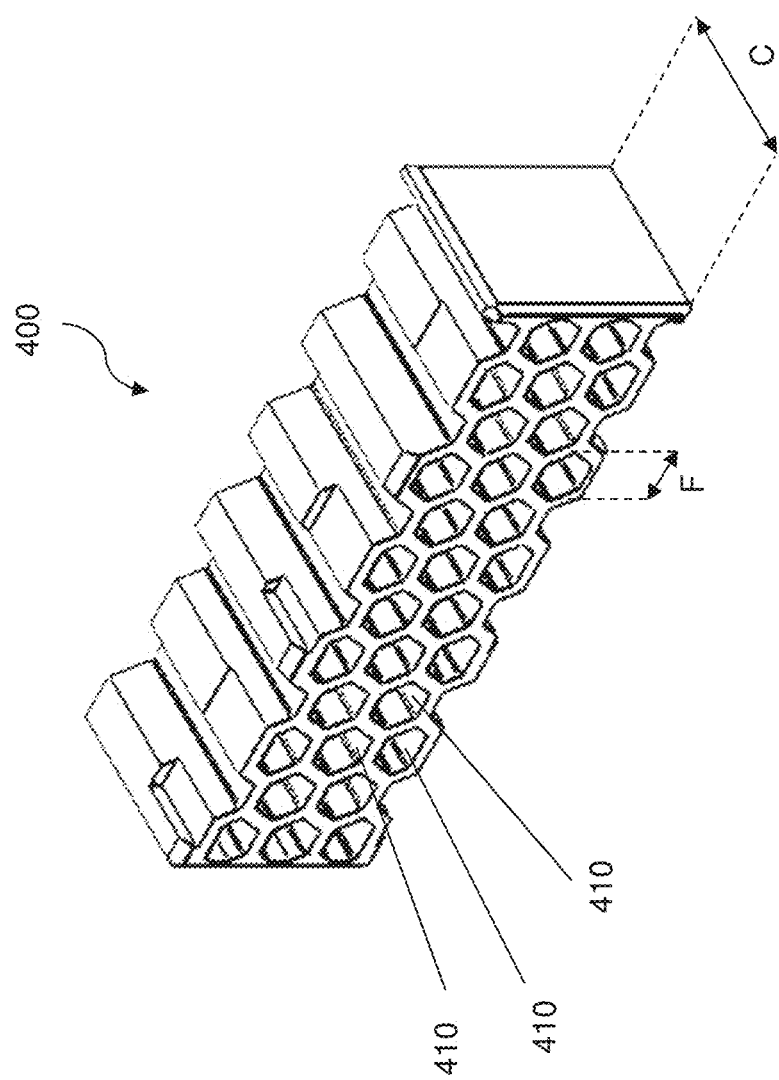
FIG. 4 is an upper, right front perspective view of an element of a cage for an electrical connector according to some embodiments.

As shown in the embodiment of FIG. 3, the second channel includes a face 314 disposed at the end of the second channel 214. The face 314 includes a plurality of holes 310 therethrough.

In some embodiments, as shown in FIG. 2, there may be an element 400 disposed within second channel 114. The element 400 may be an EMI block. The EMI block may be electrically conductive and grounded through contact with walls of the cage. In some embodiments, the EMI block may also be thermally conductive, and may be made of a suitable material to provide electrical and thermal conductivity, such as die cast metal. However, other materials may alternatively or additionally be used, such as electrically or magnetically lossy material, such as may be formed by filling a thermoplastic or thermosetting binder with conductive fibers or other particles.

Element 400 may be configured to enable air to pass through the face 314 into and through the second channel. In the embodiment shown in FIG. 4, the element 400 includes a plurality of holes 410 passing therethrough. The surface of the element 400 may form face 314 such that the holes in element 400 provide holes in the face 314. Alternatively, face 314 may be formed from sheet metal or other material used to form other walls of the cage and holes 410 of element 400 may be aligned with holes 310 of face 314. Other configurations alternatively or additionally may be used to enable airflow into the second channel, such as mounting element 400 set back from face 314 such that air may flow through face 314, into the second channel and then through element 400.

Element 400 may also be shaped and positioned to block EMI. In some embodiments, the holes 410 through element 400 may have a diameter F, and a length C, where the aspect ratio of the length C to the diameter F may be at least 3. The aspect ratio may be at least 10. For a non-circular shape, the diameter of the shape may refer to the maximum width of the shape in any direction. In various embodiments, the length C may be greater than 4 mm, less than 6 mm, or, in some embodiments, between 4 and 6 mm. In some embodiments, the length C may be between 4.9 and 5.1 mm, for example 5.0 mm. In various embodiments, the diameter F may be greater than 1 mm, less than 2 mm, or, in some embodiments, between 1 and 2 mm. In some embodiments, the diameter F may be between 1.4 and 1.5 mm, for example, 1.46 mm. In various embodiments, the aspect ratio of the length C to the diameter F of the holes may be greater than 2, less than 6, or, in some embodiments, between 2 and 6. In some embodiments, the aspect ratio may be between 3.40 and 3.45, for example, 3.42. In various embodiments, the element 400 may occupy greater than 8%, less than 12%, or, in some embodiments, between 8 and 12% of the length of the second channel. In some embodiments, the element may occupy between 9.5 and 10.5% of the length, for example, 10% of the length of the second channel.

There may also be an internal heat sink 210 disposed within the second channel. FIG. 2 shows an internal heat sink 210 disposed within the second channel 114. Such an internal heat sink is optional. An internal heat sink disposed within the second channel may contact a transceiver installed within the first channel.

According to some embodiments, the plurality of holes 310 of face 314 may be arranged in a plurality of lines 320 extending in a first direction, where each of the plurality of lines 320 is offset in the first direction from an adjacent line 320 such that holes 310 of the line are disposed between holes 310 of the adjacent line 320. The plurality of lines may include at least three lines 320. In the embodiment illustrated in FIG. 3, lines 320 are shown extending vertically. In an electronic assembly, the vertical direction may be perpendicular to the surface of a printed circuit board to which the cage is mounted. It should be appreciated that the lines need not run vertically and could run in a direction transverse to the direction illustrated, including horizontally. Packing of holes that both enables relatively high airflow and blocks EMI may be achieved regardless of the direction in which the lines or holes are oriented. In the illustrated embodiment, the holes are disposed in a regular array such that the lines run both horizontally and vertically, providing a relatively high density of holes, and enabling a relatively high air flow, while still blocking EMI.

According to some embodiments, the plurality of lines 320 may be separated by a first distance D in a second direction, where the second direction is perpendicular to the first direction. The plurality of holes 310 may be disposed in a pattern that blocks EMI while allowing airflow. In the embodiment illustrated for example, holes 310 have a width in the second direction of at least a second distance B, where the first distance D is less than the second distance B. In an embodiment where holes 310 and 410 are aligned, distance B may be configured to equal diameter F. In various embodiments, the distance D may be greater than 1 mm, less than 2 mm, or in some embodiments, between 1 and 2 mm. In some embodiments, the distance D may be between 1.47 and 1.57 mm, for example, 1.52 mm. A distance G shown in FIG. 3 may represent the perpendicular distance between two parallel sides of holes 310, in a case where holes 310 are hexagons. In various embodiments, the distance G may be greater than 0.8 mm, less than 1.8 mm, or, in some embodiments, between 0.8 and 1.8 mm. In some embodiments, the distance G may be between 1.25 and 1.35 mm, for example, 1.30 mm.

In some embodiments, the plurality of holes 310 may have perimeters with straight segments. In some embodiments, at least a portion of the plurality of holes 310 may include hexagons. In some embodiments, the plurality of holes 310 may be disposed in a honeycomb pattern.

In some embodiments, the holes 310 may collectively occupy an area that is at least 40% of the area of the face 314. In some embodiments, the holes 310 may collectively occupy an area that is at least 50% of the area of the face 314. In some embodiments, the holes 310 may collectively occupy an area that is between 50% and 60% of the area of the face 314, for example, 53.9%.

According to an embodiment, the plurality of lines 320 may be separated by a first distance D in a second direction, the second direction being perpendicular to the first direction. The face 314 may have a width E which is greater than 18 mm, less than 20 mm, or, in some embodiments, between 18 and 20 mm. Width E may be between 18.65 and 18.85 mm, for example, 18.75 mm. Width E may be configured equal to or greater than the width of a QSFP transceiver such that the first channel and third channel may be configured to receive a QSFP transceiver.

According to some embodiments, the fan 150 may be positioned to cause air to flow over or through the cage 110. For example, fan 150 may be positioned to exhaust air from enclosure 140. FIG. 1 shows fan 150 schematically adjacent a wall of enclosure 140, but fan 150 may be positioned in any suitable location. Fan 150, for example, may be positioned inside enclosure 140. In some embodiments, such as in rack mounted electronic devices, I/O connector are exposed in a front face of the enclosure, and one or more fans exhaust air from an opposite, rear face of the enclosure. However, it will be appreciated that other suitable locations may create a pressure drop that causes air to flow over components within an electronic enclosure.

The components of the electronic device may be configured such that operation of can 150 causes airflow through the second channel 114. The side walls 118b of the cage, for example, may have openings 132a or 132b such that air drawn in through the holes 310 of the face 314 may exit the side.

A pattern of openings in face 314 of a cage as described herein may enable sufficient airflow through the second channel to dissipate heat from the transceivers and the first and/or third channels to keep even a relatively dense transceiver configuration within tolerable temperature limits. That airflow may be possible without a large fan, which might draw undesirable amounts of power. In various embodiments, the fan may be configured to cause a static pressure less than 0.8 inches of water (IW), less than 1.5 IW, or, in some embodiments, between 0.8 and 1.5 IW.

Such a system may provide a desirable method of operation for an electronic system 100. The electronic system 100 may be disposed in an ambient environment. The electronic system 100 may include an enclosure 140 and within the enclosure 140, a cage 110, the cage 110 including a stacked first channel 112, second channel 114, and third channel 116. The second channel 114 may have a face 314 at an end having a plurality of holes 310 therethrough. According to some embodiments, the holes 310 may be arranged in a honeycomb pattern.

The method according to the embodiment includes transmitting and/or receiving optical signals with a transceiver disposed within the first channel 112, and/or transmitting and/or receiving optical signals with a transceiver disposed within the third channel 116. In some embodiments the transceivers in each of the first channel 112 and the third channel 116 may consume at least 1 W, less than 15 W, or, in some embodiments, between 1 and 15 W. In some embodiments, the transceivers may consume 1.5 W, 3.5 W, 7 W, 8 W, 10 W, 12 W, 14 W, or greater than 14 W. Such power dissipation is consistent with a QSFP-DD transceiver.

The method according to the embodiment includes flowing air through the holes 310 in a face 314 at the end of the second channel 214 with a fan 150 disposed within the enclosure 140. The fan 150 may be operating at a static pressure of at least 0.8 inches of water (IW), less than 1.5 IW, or between 0.8 and 1.5 IW. Heat is dissipated from the transceivers in the first channel 112 and/or the third channel 116 such that a temperature rise of both transceivers relative to an off state of the transceivers is less than 25 degrees C. With such a configuration, the heat dissipated from within the cage may be sufficient that this temperature rise may be achieved even with the electronic enclosure in an ambient environment of 25 degrees C.

In one exemplary embodiment, the system is disposed in an ambient environment of 25 degrees C. The cage is formed from sheet metal bent into a suitable shape. The cage includes a stacked first, second and third channel, the second channel being between the first and third channel, and the first channel is adjacent the circuit board. The first and third channel are each configured to receive a QSFP transceiver. Each transceiver in the first and third channels consumes 12 W of power. The holes are disposed in a honeycomb pattern and collectively occupy an area that is between 50% and 60% of the area of the face of the second channel. The area occupied may be, for example, 53.9%. The plurality of holes are arranged along a plurality of lines, where the lines are spaced 1.52 mm apart. The face of the second channel has a width which is 18.75 mm. The first channel is separate from the third channel by a distance that is measured including the internal partitions forming the second channel; the distance is 6.48 mm. The element 400 extends 10% along the length of the second channel, and the diameter of the holes through the element 400 is 1.46 mm. The aspect ratio of the length holes to the diameter of the holes through the element 400 is 3.42. The fan is disposed within the enclosure and configured to operate at a static pressure of 1.0 IW. There is a heat sink mounted to the top surface of the cage, and an internal heat sink disposed within the second channel. The temperature rise of the transceiver in the first channel relative to an off state of the transceiver is 24.7 degrees C. The temperature rise of the transceiver in the third channel relative to an off state of the transceiver is 20.0 degrees C.

It should be understood that aspects of the disclosure are described herein with reference to certain illustrative embodiments and the figures. The illustrative embodiments described herein are not necessarily intended to show all aspects of the disclosure, but rather are used to describe a few illustrative embodiments. Thus, aspects of the disclosure are not intended to be construed narrowly in view of the illustrative embodiments. In addition, it should be understood that aspects of the disclosure may be used alone or in any suitable combination with other aspects of the disclosure.

For purposes of this patent application and any patent issuing thereon, the indefinite articles "a" and "an," as used herein in the specification and in the claims, unless clearly indicated to the contrary, should be understood to mean "at least one." The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

The use of "including," "comprising," "having," "containing," "involving," and/or variations thereof herein, is meant to encompass the items listed thereafter and equivalents thereof as well as additional items.

It should also be understood that, unless clearly indicated to the contrary, in any methods claimed herein that include more than one step or act, the order of the steps or acts of the method is not necessarily limited to the order in which the steps or acts of the method are recited.

The foregoing description of various embodiments are intended merely to be illustrative thereof and that other embodiments, modifications, and equivalents are within the scope of the invention recited in the claims appended hereto.

For example, embodiments are described in which connections between a transceiver and a connector are electrical. Embodiments are possible in which the connections are optical.

What is claimed is:

1. A cage assembly for an electrical connector comprising:
    a first channel defined by conductive walls and configured to receive a transceiver;
    a second channel defined by conductive walls and adjacent the first channel, the second channel comprising a face comprising a perimeter that bounds an area of the face, the face comprising a plurality of holes therethrough collectively occupying at least 40% of the area of the face;
    a heat sink disposed in the second channel; and
    a thermally conductive element extending within the second channel between the face of the second channel and the heat sink, the thermally conductive element comprising a plurality of holes passing therethrough aligned with the plurality of holes of the face of the second channel, wherein:
        the plurality of holes are arranged in a plurality of lines extending in a first direction; and
        each of the plurality of lines is offset, in the first direction, from an adjacent line such that holes in the line are disposed between holes of the adjacent line.

2. The cage assembly of claim 1, wherein:
    the plurality of lines are separated by a first distance in a second direction, perpendicular to the first direction;
    the plurality of holes extend in the second direction by at least a second distance; and
    the first distance is less than the second distance.

3. The cage assembly of claim 1, wherein:
    the plurality of lines are separated in a second direction, perpendicular to the first direction, by a first distance;
    the face has a width in the second direction of less than 20 mm; and
    the plurality of lines comprises at least 3 lines.

4. The cage assembly of claim 1, wherein the plurality of holes have perimeters with straight segments.

5. The cage assembly of claim 4, wherein at least a portion of the plurality of holes comprise hexagons.

6. The cage assembly of claim 1, wherein the plurality of holes are disposed in a honeycomb pattern.

7. The cage assembly of claim 1, wherein the plurality of holes collectively occupy an area that is at least 50% of the area of the face.

8. The cage assembly of claim 1, wherein the plurality of holes collectively occupy an area that is between 50% and 60% of the area of the face.

9. The cage assembly of claim 1, wherein the first channel is configured to receive a QSFP transceiver.

10. The cage assembly of claim 1, wherein:
    the cage further comprises a third channel defined by conductive walls and configured to receive a second transceiver; and
    the second channel is between the first channel and the third channel.

11. An electronic system comprising:
    an enclosure having a panel with at least one opening therethrough;
    a printed circuit board within the enclosure;
    a cage mounted to the printed circuit board with the connector enclosed by the cage, the cage comprising a first channel, a second channel, and a third channel having ends exposed in the opening, the second channel being disposed between the first channel and the third channel, the end of the second channel comprising a surface comprising a plurality of holes therethrough collectively occupying more than 40% of a surface area of the surface;
    an electrical connector comprising a first electrical connector port disposed in the first channel and a second electrical connector port disposed in the third channel, the electrical connector being mounted to the printed circuit board;
    a thermally conductive element disposed within the second channel, the thermally conductive element comprising a plurality of holes passing therethrough aligned with the plurality of holes of the surface of the second; and
    at least one fan positioned to cause air to flow over the cage,
    wherein the plurality of holes are disposed in a plurality of rows with the holes in each of the plurality of rows being staggered with respect to holes in an adjacent row such that holes in the row are between holes in the adjacent row in a first direction parallel to the plurality of rows.

12. The electronic system of claim 11, wherein the plurality of rows are separated by a distance in a second direction perpendicular to the plurality of rows that is less than the dimension of the holes in the second direction.

13. The electronic system of claim 11, wherein the holes through the thermally conductive element have an aspect ratio of length to diameter of at least 3.

14. The electronic system of claim 11, wherein the at least one fan is configured to cause a static pressure of less than 1.5 IW (inches of water).

15. A method of operating an electronic system in an ambient environment comprising, within an enclosure, a stacked cage mounted to a printed circuit board comprising stacked first, second and third channels, wherein the second channel has a face at a first end, the method comprising:
    transmitting or receiving optical signals with a first transceiver consuming between 1 and 15 W, the first transceiver being disposed within the first channel and coupled to a first port of an electrical connector that is mounted to the printed circuit board;
    transmitting or receiving optical signals with a second transceiver consuming between 1 and 15 W, the second transceiver being disposed within the second channel and coupled to a second port of the electrical connector;
    flowing air through openings in the face of the second channel that collectively occupy at least 40% of an area of the face and flowing air towards the electrical connector with a fan within the enclosure, thereby dissipating heat from the first transceivers in the first channel and the second transceiver in the third channel at a rate such that a temperature rise of the first and second transceivers relative to an off state of the transceivers is less than 25 degrees C. in an ambient environment of 25 degrees C.

16. The method of claim 15, wherein:
the cage is mounted to a printed circuit board with the first channel adjacent the printed circuit board and the second channel between the first channel and the third channel.

17. The method of claim 15, wherein:
the transceivers in the first and third channels are QSFP-DD transceivers.

18. The method of claim 15, wherein:
the openings in the face are arranged in a honeycomb pattern.

\* \* \* \* \*